(12) United States Patent
Jung

(10) Patent No.: US 9,679,949 B2
(45) Date of Patent: Jun. 13, 2017

(54) ORGANIC LIGHT EMITTING DISPLAY DEVICE

(71) Applicant: SAMSUNG DISPLAY CO., LTD., Yongin, Gyeonggi-Do (KR)

(72) Inventor: Jun-Heyung Jung, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/517,656

(22) Filed: Oct. 17, 2014

(65) Prior Publication Data

US 2015/0108455 A1 Apr. 23, 2015

(30) Foreign Application Priority Data

Oct. 18, 2013 (KR) ........................ 10-2013-0124919

(51) Int. Cl.
  *H01L 27/32* (2006.01)
  *H01L 51/00* (2006.01)
  *H01L 51/52* (2006.01)

(52) U.S. Cl.
  CPC ........ *H01L 27/3246* (2013.01); *H01L 27/326* (2013.01); *H01L 27/3213* (2013.01);
  (Continued)

(58) Field of Classification Search
  CPC ........ H01L 27/32; H01L 51/52; H01L 51/00; H01L 27/3216; H01L 27/3218;
  (Continued)

(56) References Cited

U.S. PATENT DOCUMENTS

2009/0261715 A1* 10/2009 Sung ................... H01L 51/5265
  313/504
2010/0109511 A1* 5/2010 Kim ..................... H01L 27/326
  313/504
(Continued)

FOREIGN PATENT DOCUMENTS

EP    2 365 557 A2    9/2011
JP    2008-112112     5/2008
(Continued)

OTHER PUBLICATIONS

EPO Search Report dated Mar. 27, 2015, for corresponding European Patent application 14189594.6, (8 pages).
(Continued)

*Primary Examiner* — Chuong A Luu
*Assistant Examiner* — Rodolfo D Fortich
(74) *Attorney, Agent, or Firm* — Lewis Roca Rothgerber Christie LLP

(57) ABSTRACT

An organic light emitting display device is disclosed. The organic light emitting display device includes a first sub-pixel that includes a first emission region which makes a first color, a second sub-pixel that is disposed adjacent to the first sub-pixel, and includes a second emission region which makes a second color, a third sub-pixel that is disposed adjacent to the first sub-pixel, and includes a third emission region which makes a third color, and a fourth sub-pixel that is disposed adjacent to the second sub-pixel and the third sub-pixel, and includes a fourth emission region which makes a fourth color. At least one of the first to fourth sub-pixels includes a transmission region which cannot emit light and through which external light is transmitted. The transmission region is surrounded by at least one of the first to fourth emission regions.

32 Claims, 12 Drawing Sheets

(52) U.S. Cl.
CPC ...... *H01L 27/3216* (2013.01); *H01L 27/3218* (2013.01); *H01L 51/0097* (2013.01); *H01L 51/524* (2013.01); *H01L 2251/5323* (2013.01)

(58) Field of Classification Search
CPC ............. H01L 27/3213; H01L 27/3209; H01L 27/322; H01L 27/3211; H01L 27/3244; H01L 27/3248; H01L 27/3276
USPC .................................. 257/40, 72, 89, 90, 99
See application file for complete search history.

(56) References Cited

U.S. PATENT DOCUMENTS

| | | |
|---|---|---|
| 2011/0147770 A1 | 6/2011 | Hwang et al. |
| 2011/0148944 A1 | 6/2011 | Kobayashi |
| 2012/0001184 A1 | 1/2012 | Ha et al. |
| 2012/0049215 A1* | 3/2012 | Yoon .................... H01L 27/326 257/91 |
| 2012/0162208 A1* | 6/2012 | Park .................... H04N 13/0404 345/419 |
| 2013/0016313 A1 | 1/2013 | Shim et al. |
| 2014/0183479 A1 | 7/2014 | Park et al. |
| 2014/0225078 A1 | 8/2014 | Jeung et al. |

FOREIGN PATENT DOCUMENTS

| | | |
|---|---|---|
| KR | 10-2009-0122023 | 11/2009 |
| KR | 10-2011-0071446 | 6/2011 |
| KR | 10-2013-0007746 | 1/2013 |
| KR | 10-2014-0101605 | 8/2014 |

OTHER PUBLICATIONS

EPO Search Report dated Mar. 26, 2015, for corresponding European Patent application 14189595.3, (7 pages).

* cited by examiner

ORGANIC LIGHT EMITTING DISPLAY DEVICE

CROSS-REFERENCE TO RELATED APPLICATION

This application claims priority to and the benefit of Korean Patent Application No. 10-2013-0124919, filed on Oct. 18, 2013, in the Korean Intellectual Property Office, the disclosure of which is incorporated herein in its entirety by reference.

BACKGROUND

1. Field

One or more embodiments of the present invention relate to an organic light emitting display device.

2. Description of the Related Art

Organic light emitting display devices have desirable characteristics in terms of viewing angle, contrast, response time, and power consumption, and thus, the field of their application is being expanded from personal portable devices, such as MP3 players and portable terminals, to electronic devices such as televisions (TVs).

Unlike liquid crystal display (LCD) devices, organic light emitting display devices have a self-emitting characteristic, and therefore do not need a separate light source. Therefore, the thickness and weight of an organic light emitting display device are lower.

Moreover, a thin film transistor (TFT) and an organic light emitting element of an organic light emitting display device are transparent, and thus, the organic light emitting display device may be manufactured as a transparent display device.

SUMMARY

One or more embodiments of the present invention include a transparent organic light emitting display device having a high resolution.

Additional aspects will be set forth in part in the description which follows and, in part, will be apparent from the description, or may be learned by practice of the presented embodiments.

According to one or more embodiments of the present invention, an organic light emitting display device includes a plurality of pixels, wherein each of the plurality of pixels includes: a first sub-pixel including a first emission region to emit light of a first color; a second sub-pixel disposed adjacent to the first sub-pixel, and including a second emission region to emit light of a second color; a third sub-pixel disposed adjacent to the first sub-pixel, and including a third emission region to emit light of a third color; and a fourth sub-pixel disposed adjacent to the second sub-pixel and the third sub-pixel, and including a fourth emission region to emit light of a fourth color, at least one of the first, second, third or fourth sub-pixels comprises a transmission region which cannot emit light and which is to transmit external light, and the transmission region is disposed inside of each of the plurality of pixels.

The transmission region may include: a first transmission region disposed in the first sub-pixel; a second transmission region disposed in the second sub-pixel; and a third transmission region disposed in the third sub-pixel.

The fourth emission region may have lower emission efficiency than that of each of the first to third emission regions, and in one embodiment the transmission region does not extend into the fourth sub-pixel.

At least two of the first to third transmission regions may be contiguous.

At least one portion of the transmission region may be disposed adjacent to the fourth sub-pixel.

The transmission region may further include a fourth transmission region disposed in the fourth sub-pixel.

The first to fourth transmission regions may be disposed adjacent to each other as one region.

The fourth emission region may have a lower emission efficiency than that of each of the first to third emission regions, and the fourth transmission region may have a narrower area than that of each of the first to third transmission regions.

Each of the first to fourth sub-pixels comprises a plurality of first to fourth transmission regions, respectively.

The first and second transmission regions may be disposed adjacent to each other as one region, and the third and fourth transmission regions may be disposed adjacent to each other as one region.

The first and second transmission regions may not be adjacent to the third and fourth emission regions, and the third and fourth transmission regions may not be adjacent to the first and second emission regions.

The fourth emission region may have lower emission efficiency than that of each of the first to third emission regions, and the fourth transmission region may have a narrower area than that of each of the first to third transmission regions.

The first and second transmission regions may be adjacent to the third and fourth emission regions, respectively.

In one embodiment no two of the first to fourth transmission regions are connected to each other.

The fourth emission region may have lower emission efficiency than that of each of the first to third emission regions, and the fourth transmission region may have a narrower area than that of each of the first to third transmission regions.

The first color may be red, the second color and third color may be green, and the fourth color is blue.

The second sub-pixel may be adjacent to the first sub-pixel in a first direction which is inclined with respect to a horizontal direction, the third sub-pixel may be adjacent to the first sub-pixel in a second direction which is inclined with respect to a vertical direction, and the fourth sub-pixel may be adjacent to the third sub-pixel in the first direction and is adjacent to the second sub-pixel in the second direction.

The second sub-pixel may be aligned adjacent to the first sub-pixel in a horizontal direction, the third sub-pixel may be aligned adjacent to the first sub-pixel in a vertical direction, and the fourth sub-pixel may be aligned adjacent to the third sub-pixel in the horizontal direction and is aligned adjacent to the second sub-pixel in the vertical direction.

The organic light emitting display device may further include: first to fourth sub-pixel electrodes that are formed on a substrate, and are respectively disposed in the first to fourth sub-pixels; an opposite electrode that is disposed to be opposite to the first to fourth sub-pixel electrodes; and first to fourth emission layers that are respectively disposed between the first to fourth sub-pixel electrodes and the opposite electrode.

The first to fourth sub-pixel electrodes may be formed to have the same shape, at least one of the first to fourth sub-pixel electrodes may overlap the transmission region, and the opposite electrode may include a first transmission window in which a region corresponding to the transmission region is opened.

At least one of the first to fourth sub-pixel electrodes may not be formed in a region corresponding to the transmission region.

The opposite electrode may include a first transmission window in which a region corresponding to at least a portion of the transmission region is opened.

The organic light emitting display device may further include at least one insulating layer formed on the substrate, wherein the at least one insulating layer comprises a second transmission window in which a region corresponding to at least a portion of the transmission region is opened.

The substrate may be flexible.

According to one or more embodiments of the present invention, an organic light emitting display device includes: a substrate; an organic light emitting unit formed on the substrate; and a sealing unit formed on the substrate, and sealing the organic light emitting unit, wherein the organic light emitting unit includes: a plurality of first pixels that include at least two sub-pixels which respectively emit light of different colors; a plurality of second pixels that include at least two sub-pixels which respectively emit light of different colors, and emit light along with at least one sub-pixel of a corresponding first pixel to realize full white color, wherein the plurality of first pixels and the plurality of second pixels are alternately disposed along one direction; and a plurality of transmission regions that are disposed in at least one of the sub-pixels of the plurality of first pixels and the plurality of second pixels, the plurality of transmission regions configured to transmit external light to be transmitted in a direction which passes through the substrate, the organic light emitting unit, and the sealing unit, the plurality of transmission regions separated from each other, and the plurality of transmission regions configured to not emit light.

Each of the plurality of first pixels may include a red sub-pixel and a green sub-pixel, each of the plurality of second pixels may include a green sub-pixel and a blue sub-pixel, and the green sub-pixel of each first pixel is aligned not to be adjacent to the green sub-pixel of each second pixel.

The first pixels of the plurality of first pixels and the second pixels of the plurality of second pixels may extend along a first direction which is inclined with respect to a horizontal direction, and the first pixels of the plurality of first pixels and the second pixels of the plurality of second pixels may be alternately disposed along a second direction which is inclined with respect to a vertical direction.

The first pixels of the plurality of first pixels and the second pixels of the plurality of second pixels may extend along a horizontal direction, and the first pixels of the plurality of first pixels and the second pixels of the plurality of second pixels may be alternately disposed along a vertical direction.

The organic light emitting unit may include: a plurality of sub-pixel electrodes that are respectively disposed in the sub-pixels of the plurality of first pixels and the plurality of second pixels, and are separated from each other; and an opposite electrode that is disposed to be opposite to the plurality of sub-pixel electrodes, and at least one of the sub-pixels does not overlap any of the plurality of transmission regions.

The organic light emitting unit may include: a plurality of sub-pixel electrodes that are respectively disposed in the sub-pixels of the plurality of first pixels and the plurality of second pixels, and are separated from each other; and an opposite electrode that is disposed to be opposite to the plurality of sub-pixel electrodes, and includes a plurality of first transmission windows, being regions, corresponding to at least portions of the plurality of transmission regions, opened through the opposite electrode.

The organic light emitting unit may further include at least one insulating layer that is formed on the substrate, and the at least one insulating layer may include a plurality of second transmission windows, being regions, corresponding to at least portions of the plurality of transmission regions, opened through the at least one insulating layer.

The substrate and the sealing unit may be configured to be flexible.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
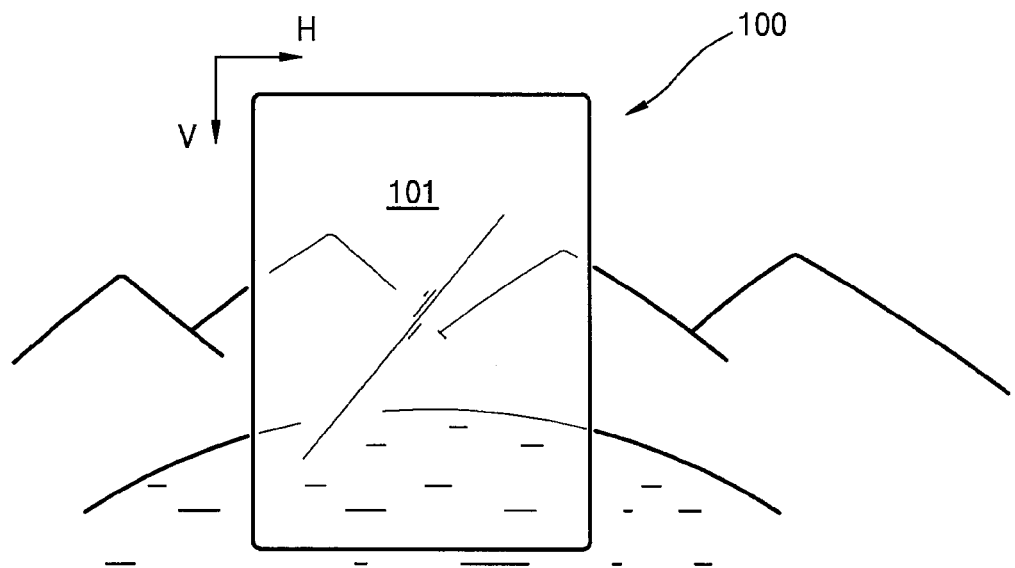
FIG. 1 is a plan view illustrating an organic light emitting display device according to an embodiment of the present invention.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Since the present invention may have diverse modified embodiments, preferred embodiments are illustrated in the drawings and are described in the detailed description of the present application. The advantages, features and aspects of the present invention will become apparent from the following description of the embodiments with reference to the accompanying drawings, which is set forth hereinafter. The present invention may, however, be embodied in different forms and should not be construed as limited to the embodiments set forth herein.

Hereinafter, embodiments of the present invention will be described in more detail with reference to the accompanying drawings. In addition, in the present specification and drawings, like reference numerals refer to like elements throughout, and thus, a redundant description is omitted.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, one or more intervening layers, regions, or components may be present.

When a certain embodiment may be implemented differently, a specific process order may be performed differently from the described order. For example, two consecutively described processes may be performed substantially at the same time or performed in an order opposite to the described order.

Sizes of elements in the drawings may be exaggerated for convenience of explanation. In other words, since sizes and thicknesses of components in the drawings are arbitrarily illustrated for convenience of explanation, and the following embodiments are not limited thereto.

FIG. 1 is a plan view illustrating an organic light emitting display device 100 according to an embodiment of the present invention. In the organic light emitting display device 100, an image is displayed on a screen 101. When an image is being displayed on the screen 101 and/or when the screen 101 is in an off state, external light is transmitted in a thickness direction of the organic light emitting display device 100, and thus, a user located in front of a device may view, through the device, an object and/or a background behind the device.

The screen 101 of the organic light emitting display device 100, as seen in FIG. 1, may be provided in a rectangular shape having sides parallel to a horizontal direction H and a vertical direction V, but the present embodiment is not limited thereto. For example, the screen 101 may be provided in a circular shape or a polygonal shape. Also, the organic light emitting display device 100 may be manufactured or designed to be flexible.

Figure 2:
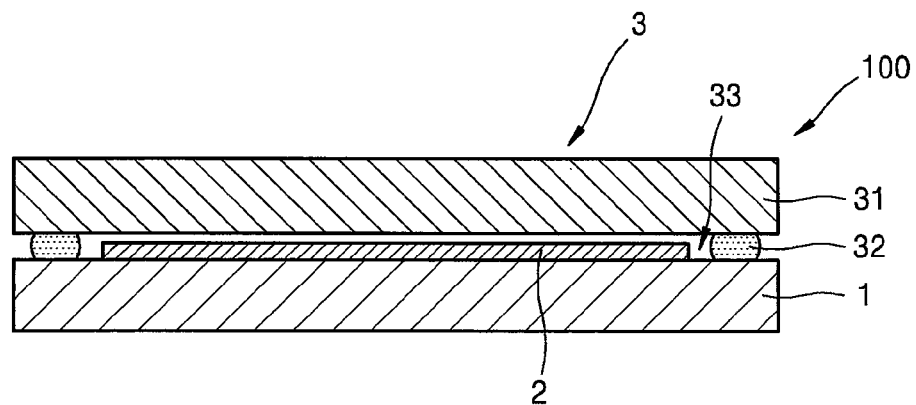
FIG. 2 is a cross-sectional view illustrating an organic light emitting display device according to an embodiment of the present invention.

The organic light emitting display device 100 may, for example, be configured as illustrated in FIG. 2.

Referring to FIG. 2, the organic light emitting display device 100 according to an embodiment of the present invention includes an organic light emitting unit 2, which is formed at one surface of a substrate 1, and a sealing unit 3 that seals the organic light emitting unit 2. The substrate 1 may be formed of glass, metal, or plastic, and may be provided to be flexible.

In the embodiment of FIG. 2, the sealing unit 3 may be a sealing substrate 31. The sealing substrate 31 may be formed of transparent glass or a plastic substrate. The sealing substrate 31 allows the organic light emitting unit 2 to produce an image, and prevents external air and moisture from penetrating into the organic light emitting unit 2. The sealing substrate 31 may be provided to be flexible, and thus, the organic light emitting display device 100 may be manufactured to be wholly flexible.

An edge of the substrate 1 is coupled to an edge of the sealing substrate 31 by a sealing material 32, and a space 33 between the substrate 1 and the sealing substrate 31 is sealed. A moisture absorbent or a filler may be disposed in the space 33.

Figure 3:
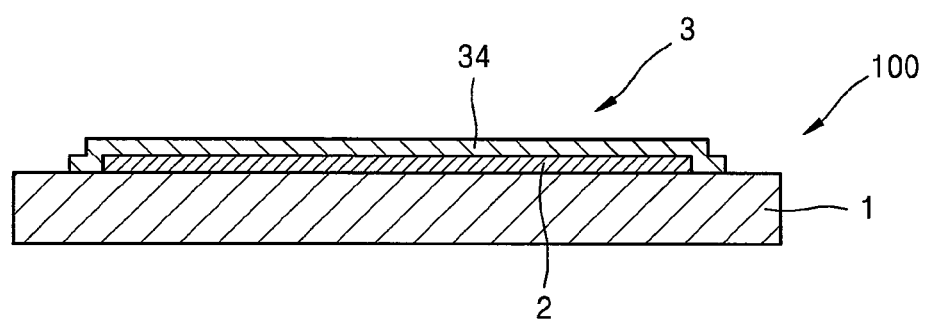
FIG. 3 is a cross-sectional view illustrating an organic light emitting display device according to another embodiment of the present invention.

As seen in FIG. 3, in another embodiment, a thin film encapsulating layer 34 instead of the sealing substrate 31 is formed on the organic light emitting unit 2, and protects the organic light emitting unit 2 from external air. When the thin film encapsulating layer 34 is applied instead of the sealing substrate 31, the organic light emitting display device 100 is more flexible.

The thin film encapsulating layer 34 may be formed of a plurality of inorganic layers, or may be formed by a combination of an inorganic layer and an organic layer.

The organic layer of the thin film encapsulating layer 34 may be formed of a polymer, and may be a single layer or a stack of layers including layers formed of a material selected from polyethyleneterephthalate, polyimide, polycarbonate, epoxy, polyethylene, and polyacrylate. For example, the organic layer may be formed of polyacrylate, and in particular, may include a material in which a monomer composition containing a diacrylate-based monomer and a triacrylate-based monomer is polymerized. The monomer composition may further contain a monoacrylate-based monomer. Also, the monomer composition may further contain a photoinitiatior, as is known to one of ordinary skill in the art.

The inorganic layer of the thin film encapsulating layer 34 may be a single layer or a stack of layers, containing metal oxide or metal nitride. In particular, the inorganic layer or layers may include a material selected from SiNx, $Al_2O_3$, $SiO_2$, and $TiO_2$.

An externally exposed uppermost layer of the thin film encapsulating layer 34 may be formed of an inorganic layer so as to prevent moisture from penetrating into an organic light emitting element of the display device.

The thin film encapsulating layer 34 may, for example, include at least one sandwich structure in which at least one organic layer is between at least two inorganic layers. As another example, the thin film encapsulating layer 34 may include at least one sandwich structure in which at least one inorganic layer is between at least two organic layers. As yet another example, the thin film encapsulating layer 34 may include a sandwich structure in which at least one organic layer is between at least two inorganic layers and a sandwich structure in which at least one inorganic layer is between at least two organic layers.

The thin film encapsulating layer 34 may include a first inorganic layer, a first organic layer, and a second inorganic layer in this order from an upper portion of the organic light emitting unit 2.

As another example, the thin film encapsulating layer 34 may include a first inorganic layer, a first organic layer, a second inorganic layer, a second organic layer, and a third inorganic layer in this order from the upper portion of the organic light emitting unit 2.

As another example, the thin film encapsulating layer 34 may include a first inorganic layer, a first organic layer, a second inorganic layer, a second organic layer, a third inorganic layer, a third organic layer, and a fourth inorganic layer in this order from the upper portion of the organic light emitting unit 2.

A halogenated metal layer including LiF may additionally be formed between the organic light emitting unit 2 and the first inorganic layer. The halogenated metal layer prevents the organic light emitting unit 2 from being damaged when the first inorganic layer is formed by a sputtering process or a plasma deposition process.

The first organic layer may be narrower in area than the second inorganic layer, and the second organic layer, and the second organic layer may also be narrower in area than the third inorganic layer.

As another example, the first organic layer may be formed to be fully covered by the second inorganic layer, and the second organic layer may be formed to be fully covered by the third inorganic layer.

In the embodiments of FIGS. 2 and 3, a bottom emission type (kind) in which an image is realized in the direction of the substrate 1 may be implemented, and a top emission type (kind) in which an image is realized in the direction of the sealing substrate 31 or the thin film encapsulating layer 34 may be implemented. Also, a dual emission type in which an image is realized in both the direction of the substrate and of the sealing substrate 31, or in both the direction of the substrate 1 and of the thin film encapsulating layer 34 may be implemented.

In one embodiment, the organic light emitting unit 2 is divided into an emission region and a transmission region; this configuration enables a transparent and/or see-through display device to be implemented.

When a display device has one or more transmission regions configured as lines extending across the display device, a user may perceive the image as being disconnected, and emission efficiency or resolution may be degraded. Embodiments of the present invention mitigate these disadvantages.

Figure 4:
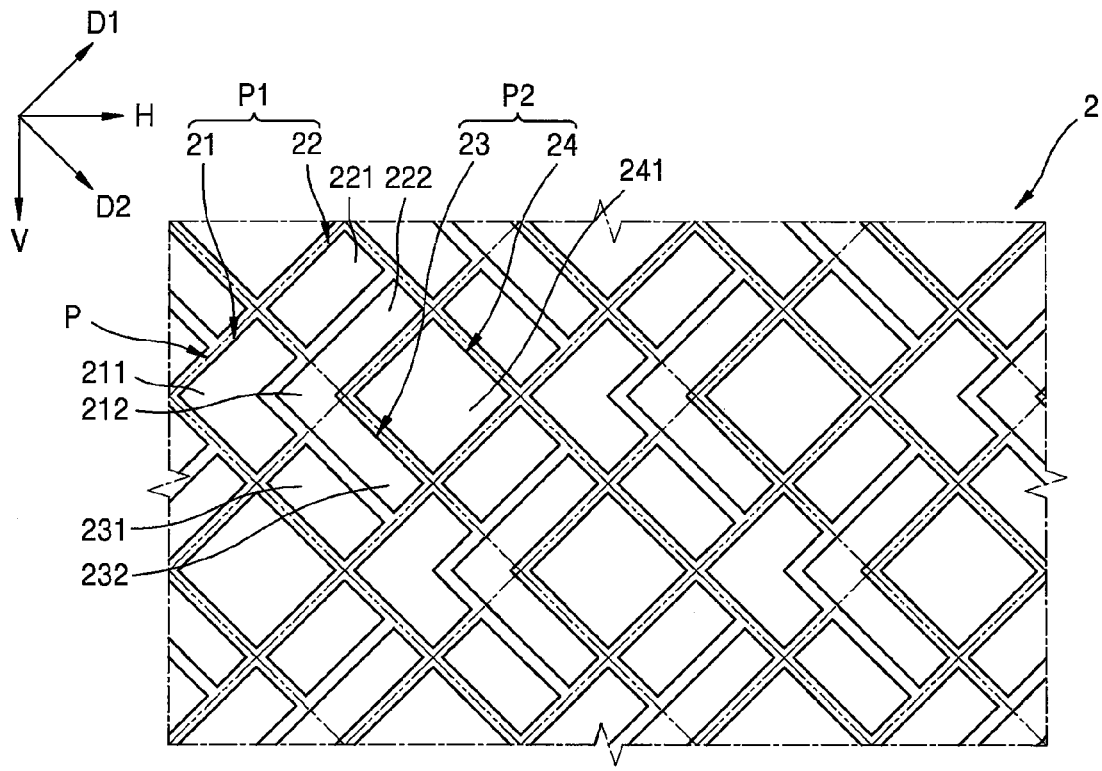
FIG. 4 is a plan view illustrating an embodiment of some pixels of an organic light emitting unit of embodiments according to FIG. 2 or FIG. 3.

FIG. 4 is a plan view illustrating an embodiment of some pixels of the organic light emitting unit 2 of FIGS. 2 and 3.

According to the embodiment of FIG. 4, the organic light emitting unit 2 includes a first sub-pixel 21, a second sub-pixel 22 which is adjacent to the first sub-pixel 21 in a first direction D1, a third sub-pixel 23 which is adjacent to the first sub-pixel 21 in a second direction D2, and a fourth sub-pixel 24 which is adjacent to the second and third sub-pixels 22 and 23. The first direction D1 is perpendicular to the second direction D2, and may be a direction inclined upward from a horizontal direction H. The second direction D2 may be a direction inclined from a vertical direction V toward the horizontal direction H. The first to fourth sub-pixels 21 to 24 may be formed in a tetragonal shape (i.e., in the shape of a four-sided polygon). The first sub-pixel 21 and the fourth sub-pixel 24 may be aligned in a diagonal direction, and the second sub-pixel 22 and the third sub-pixel 23 may be aligned in a diagonal direction.

The first to fourth sub-pixels 21 to 24 constitute one pixel P, which may produce light of a full white color. The organic light emitting unit 2 may include a plurality of the pixels P. This configuration may be employed in embodiments of the present invention described below.

Optionally, the first and second sub-pixels 21 and 22 which are adjacent to each other may constitute a first pixel P1, and the third and fourth sub-pixels 23 and 24 which are adjacent to each other may constitute a second pixel P2. A plurality of first pixels P1 may be provided, and may be repeatedly disposed in the first direction D1. A plurality of second pixels P2 may also be provided, and may be repeatedly disposed in the first direction D1. The first pixel P1 and the second pixel P2 may be alternately disposed in the second direction D2. This configuration may be employed in embodiments of the present invention described below.

The arrangement of the first pixel P1 and the second pixel P2 is not limited to those described above, and the first pixel P1 and the second pixel P2 may be variously arranged in a manner such that a full white color is realized by a combination of the first pixel P1 and the second pixel P2.

The first sub-pixel 21 includes a first emission region 211 which emits light of a first color, and the second sub-pixel 22 includes a second emission region 221 which emits light of a second color. The third sub-pixel 23 includes a third emission region 231 which emits light of a third color, and the fourth sub-pixel 24 includes a fourth emission region 241 which emits light of a fourth color. The first color may be red light, the second color and the third color may be green light, and the fourth color may be blue light.

The resolution of a screen may be further enhanced by the arrangement of the first pixel P1 and the second pixel P2.

One of the second color and the third color may be white light instead of green light. More natural full white color may be realized in such an embodiment.

According to an embodiment, at least one of the first to fourth sub-pixels 21 to 24 may include a transmission region which cannot emit light and through which external light is transmitted, and the transmission region may be surrounded by at least one of the first to fourth emission regions 211 to 241, and for example, the transmission region may be disposed inside of the pixel P1.

Referring to FIG. 4, the transmission region may include a first transmission region 212 which is disposed in the first sub-pixel 21, a second transmission region 222 which is disposed in the second sub-pixel 22, and a third transmission region 232 which is disposed in the third sub-pixel 23. The fourth sub-pixel 24 may lack a transmission region. The fourth emission region 241 of the fourth sub-pixel 24 may be an emission region the emission efficiency of which is the lowest, among the first to fourth emission regions 211 to 241. According to an embodiment, a sub-pixel having low emission efficiency may lack a transmission region, and thus, the resolution or emission efficiency, or both, are prevented from being degraded due to implementation of a transparent display.

According to an embodiment, the first transmission region 212 may have a narrower area than those of the second and third transmission regions 222 and 232. When the second emission region 221 and the third emission region 231 emit light of the same color (for example, green light), a sufficient transmittance is secured by the combination of the second transmission region 222 and the third transmission region 232 in the first pixel P1 and the second pixel P2, and thus, the first transmission region 212 may be formed to be relatively narrow, thereby allowing the first sub-pixel 21 to retain a reasonable emission efficiency.

According to an embodiment, an emission region is not formed between the first to third transmission regions 212 to 232. For example, the first to third transmission regions 212 to 232 may be contiguous, i.e., connected to each other, and may be disposed adjacent to each other as one region. Such a configuration may provide a sufficiently large transmission region, and provide for sufficient transmittance of external light. The first to third transmission regions 212 to 232 which are connected to each other may be disposed adjacent to the fourth sub-pixel 24. The first to third transmission regions 212 to 232 are surrounded by the first to fourth emission regions 211 to 241, and are surrounded by first sub-pixels of the adjacent first pixel P1. Since the transmission region is surrounded by the emission regions, the transmission region has no structure which extends across the whole screen, and thus, a displayed image is prevented from being perceived as disconnected.

Figure 5:
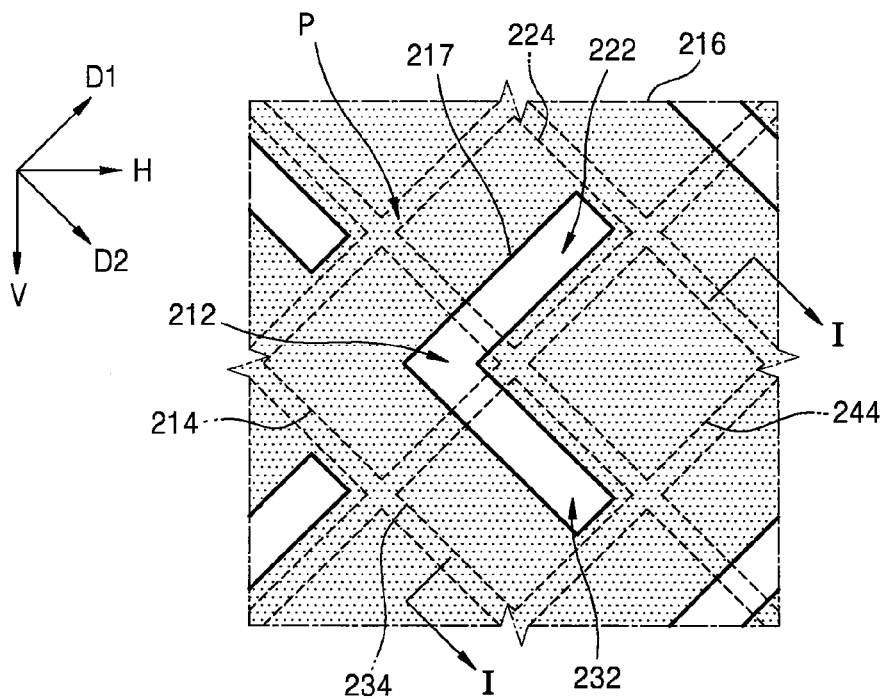
FIG. 5 is a plan view of an embodiment illustrating in detail a portion of an embodiment according to FIG. 4.
Figure 6:
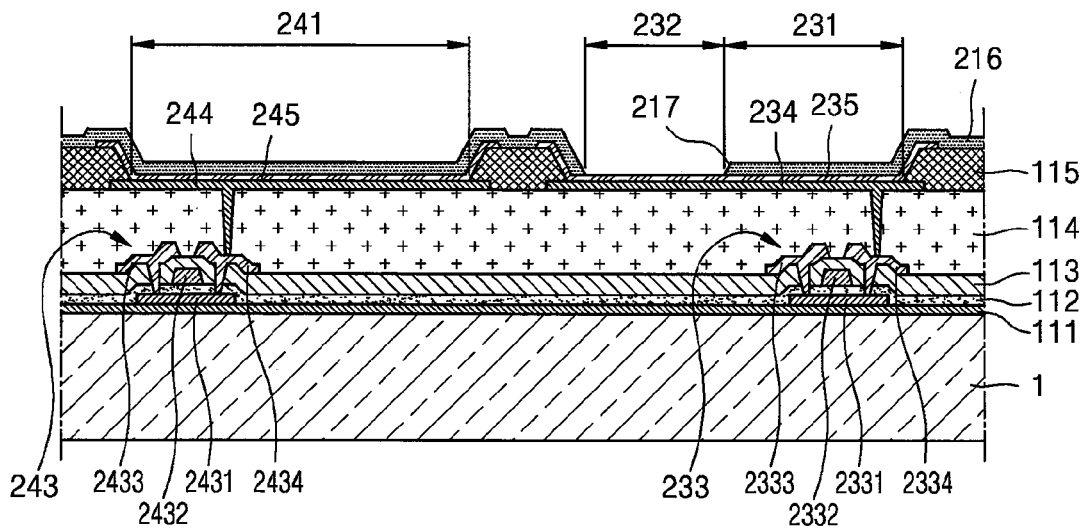
FIG. 6 is a cross-sectional view taken along line I-I of FIG. 5.

FIG. 5 is a plan view of an embodiment illustrating in more detail a portion of an embodiment according to FIG. 4, and FIG. 6 is a cross-sectional view taken along line I-I of FIG. 5.

Referring to FIGS. 5 and 6, the first to fourth sub-pixels 21 to 24 include first to fourth sub-pixel electrodes 214 to 244, respectively. The first to fourth sub-pixel electrodes 214 to 244 may be formed to have the same shape and size, and for example, may each be formed in a tetragonal shape having the same size. However, the present embodiment is not limited thereto, and the first to fourth sub-pixel electrodes 214 to 244 may have different sizes.

The first to third sub-pixel electrodes 214 to 234 may extend to the first to third transmission regions 212 to 232, respectively.

Although not shown, each of the first to fourth sub-pixels 21 to 24 may include a pixel circuit unit, which may include a thin film transistor (TFT) and a capacitor. A plurality of the pixel circuit units may be electrically connected to the first to fourth sub-pixel electrodes 214 to 244, respectively.

In FIG. 6, only one TFT of a third sub-pixel circuit 233 and one TFT of a fourth sub-pixel circuit 243 are illustrated.

A buffer layer 111 is formed on one surface of the substrate 1, and a plurality of TFTs are formed on the buffer layer 111.

First, a plurality of semiconductor active layers 2331 and 2431 are formed on the buffer layer 111.

The buffer layer 111 prevents penetration of an impure element and planarizes a surface. The buffer layer 111 may be formed of various materials that perform these functions. For example, the buffer layer 111 may be formed of an inorganic material (such as silicon oxide, silicon nitride, silicon oxynitride, aluminum oxide, aluminum nitride, titanium oxide, or a titanium nitride), an organic material (such as polyimide, polyester, or acryl), or a stacked body thereof. The buffer layer 111 is not an essential element, and may be omitted depending on the case.

The semiconductor active layers 2331 and 2431 may be formed of polycrystalline silicon, but the present embodiment is not limited thereto. The semiconductor active layers 2331 and 2431 may be formed of an oxide semiconductor. For example, each of the semiconductor active layers 2331 and 2431 may be a G-I-Z—O layer [a $(In_2O_3)_a(Ga_2O_3)_b(ZnO)_c$ layer] (where, a, b, and c are real numbers that satisfy conditions "a>=0, b>=0, and c>0").

A gate insulating layer 112 is formed on the buffer layer 111 to cover the semiconductor active layers 2331 and 2431, and a plurality of gate electrodes 2332 and 2432 are formed on the gate insulating layer 112.

An interlayer insulating layer 113 is formed on the gate insulating layer 112 to cover the gate electrodes 2332 and 2432. A plurality of source electrodes 2333 and 2433 and drain electrodes 2334 and 2434 are formed on the interlayer insulating layer 113, and contact the semiconductor active layers 2331 and 2431, respectively, through contact holes.

The structure of each of the TFTs is not limited to the structure described above, and the TFTs may be formed to have various structures.

As seen in FIG. 6, a passivation layer 114 is formed on the interlayer insulating layer 113 to cover the TFTs, and the third sub-pixel electrode 234 and the fourth sub-pixel electrode 244 are formed on the passivation layer 114. Although not shown, the first sub-pixel electrode 214 and the second sub-pixel electrode 224 are also formed on the passivation layer 114.

The third sub-pixel electrode 234 and the fourth sub-pixel electrode 244 may respectively contact the drain electrodes 2334 and 2434 of each TFT through a via hole which is formed at the passivation layer 114.

A pixel defining layer 115 is formed on the passivation layer 114 to cover edges of the third sub-pixel electrode 234 and the fourth sub-pixel electrode 244.

According to an embodiment, the first to fourth sub-pixel electrodes 214 to 244 may overlap the sub-pixel circuits of the respective sub-pixels, and may be aligned to cover the respective sub-pixel circuits. Therefore, a user cannot view the pixel circuit in a region other than the emission region. Also, in some embodiments, the pixel circuits do not overlap the transmission region. This is because such overlap with the pixel circuits may degrade the transmittance of the transmission region.

A third emission layer 235 is formed on the third sub-pixel electrode 234, and a fourth emission layer 245 is formed on the fourth sub-pixel electrode 244. Although not shown, a first emission layer is formed on the first sub-pixel electrode 214, and a second emission layer is formed on the second sub-pixel electrode 224.

A second electrode 216 is formed to cover the third emission layer 235 and the fourth emission layer 245. The second electrode 216 is an electrode to which a common voltage is applied, and which is formed to cover all the sub-pixels of the organic light emitting unit.

Each of the first to fourth sub-pixel electrodes may be an anode electrode, and the second electrode 216 may be a cathode electrode. A polarity of the anode electrode may be opposite to a polarity of the cathode electrode.

Each of the first to fourth emission layers may be an organic emission layer. According to an embodiment, the first emission layer may include an organic emitting material that emits red light, the second and third emission layers may include an organic emitting material that emits green light, and the fourth emission layer may include an organic emitting material that emits blue light. Although not shown in FIG. 6, at least one or more organic layers including a hole injection transport layer and/or an electron injection transport layer may be further formed between the third and fourth sub-pixel electrodes 234 and 244 and the second electrode 216. The hole injection transport layer and the electron injection transport layer are a common layer, and may be formed to cover all the sub-pixels of the organic light emitting unit.

Organic layers including the first to fourth emission layers may be formed by various processes such as a vacuum deposition process, a printing process, and a laser heat transfer process.

The buffer layer 111, the gate insulating layer 112, the interlayer insulating layer 113, the passivation layer 114, and/or the pixel defining layer 115 may be formed of an insulating layer having a high light transmittance.

Each of the first to fourth sub-pixel electrodes 214 to 244 may be a transparent electrode, a semi-transparent electrode, or a reflective electrode, and may include indium tin oxide (ITO), indium zinc oxide (IZO), zinc oxide (ZnO), or indium oxide ($In_2O_3$).

The second electrode 216 may be a transparent electrode, a semi-transparent electrode, or a reflective electrode, and may include silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), ytterbium (Yb), or a compound thereof.

As illustrated in FIG. 5, when the first to fourth sub-pixel electrodes 214 to 244 are formed in the transmission region, the first to fourth sub-pixel electrodes 214 to 244 may be formed as a transparent electrode.

As seen in FIGS. 5 and 6, a first transmission window 217 may be formed in an opening type (kind) in the second electrode 216, and may be configured to define a transmission portion. The first transmission window 217 may be formed over the first transmission region 212, the second transmission region 222, and the third transmission region 232.

According to one embodiment, the first transmission window 217 is formed at the second electrode 216, and the second electrode 216 includes metal which has a low transmittance and a high reflectance; therefore, a transmittance of external light in a thickness direction of the organic light emitting display device is further enhanced in the first transmission region 212, the second transmission region 222, and the third transmission region 232. In this embodiment, the second electrode 216 is formed to be a reflective electrode by forming the second electrode 216 to be relatively thick, and thus, a bottom emission type (kind) transparent display in which an image is realized in a direction of the substrate 1 is implemented. In this case, a transmittance of external light is prevented from being degraded in the transmission region by the first transmission window 217. In another embodiment, the second electrode 216 is formed of a semi-transparent reflective layer by forming the second electrode 216 to be relatively thin, or by forming it of a transparent electrode material, and thus, a top emission type transparent display in which an image is realized in the opposite direction to the substrate 1 is implemented, or a dual emission type (kind) transparent display in which an image is realized in both the direction of the substrate 1 and the opposite direction to the substrate 1 is implemented.

Figure 7:
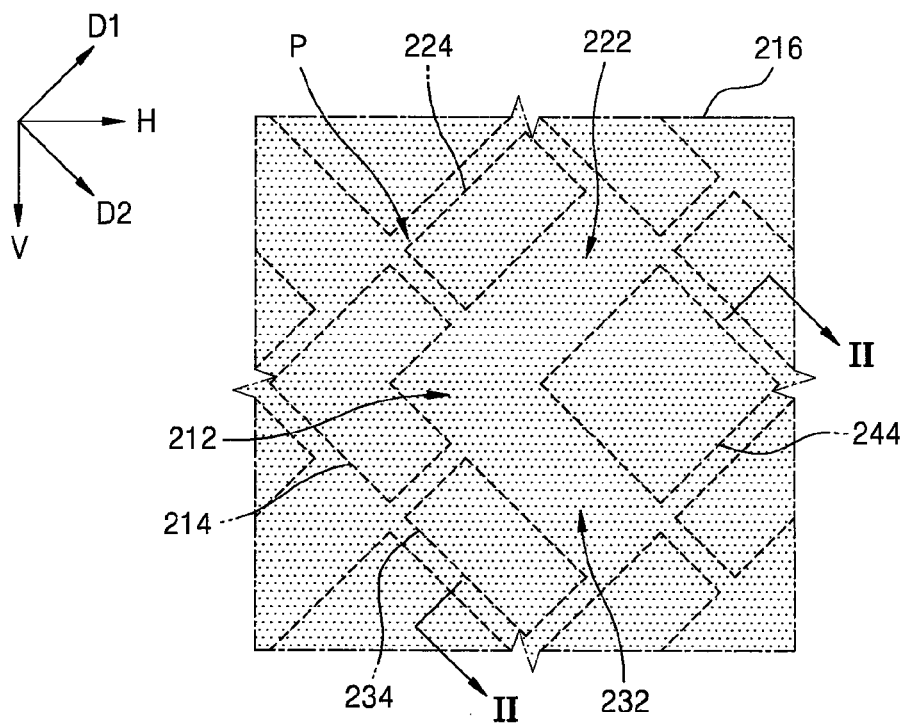
FIG. 7 is a plan view of another embodiment illustrating in detail a portion of an embodiment according to FIG. 4.
Figure 8:
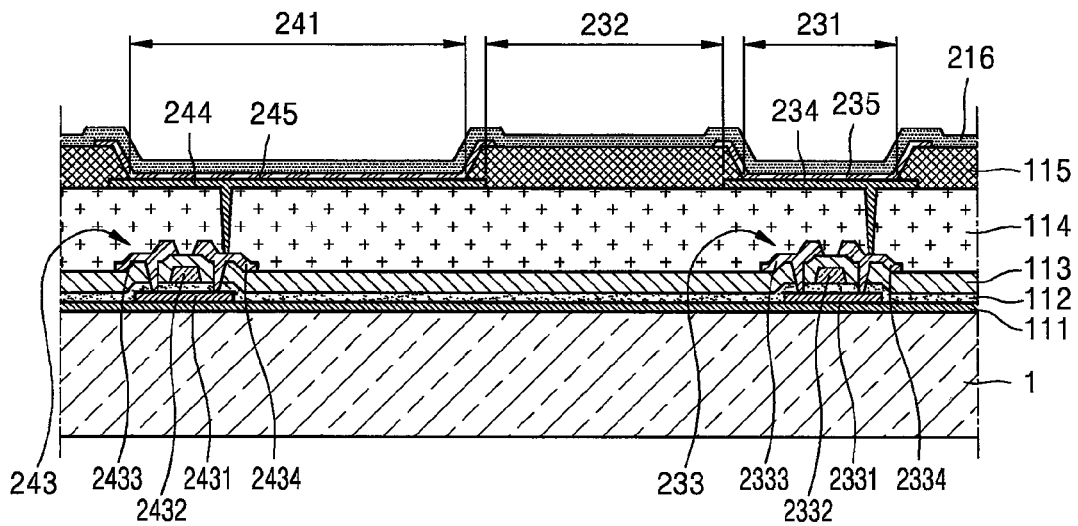
FIG. 8 is a cross-sectional view taken along line II-II of FIG. 7.

FIG. 7 is a plan view of another embodiment illustrating in more detail a portion of an embodiment according to FIG. 4, and FIG. 8 is a cross-sectional view taken along line II-II of FIG. 7.

Referring to FIGS. 7 and 8, the first to fourth sub-pixels 21 to 24 include the first to fourth sub-pixel electrodes 214 to 244, respectively. In this case, the sizes and shapes of the first to third sub-pixel electrodes 214 to 234 are formed not to overlap the first to third transmission regions 212 to 232. Therefore, the first sub-pixel electrode 214 may have a shape in which a portion of a corner is cut, the second and third sub-pixel electrodes 224 and 234 may have a rectangular shape in which one side is cut in a length direction, and the fourth sub-pixel electrode 244 may have a shape which is not cut. Therefore, a transmittance is prevented from being degraded in the transmission region by the sub-pixel electrodes. The second electrode 216 is formed in the transmission region, but in this case, the second electrode 216 is formed of a thin layer to increase its light transmittance, thereby minimizing a loss of a transmittance in the transmission region.

According to an embodiment, the first to fourth sub-pixel electrodes 214 to 244 are formed of a reflective electrode, and thus, a top emission type (kind) transparent display in which an image is realized in the opposite direction to the substrate 1 is implemented.

Figure 9:
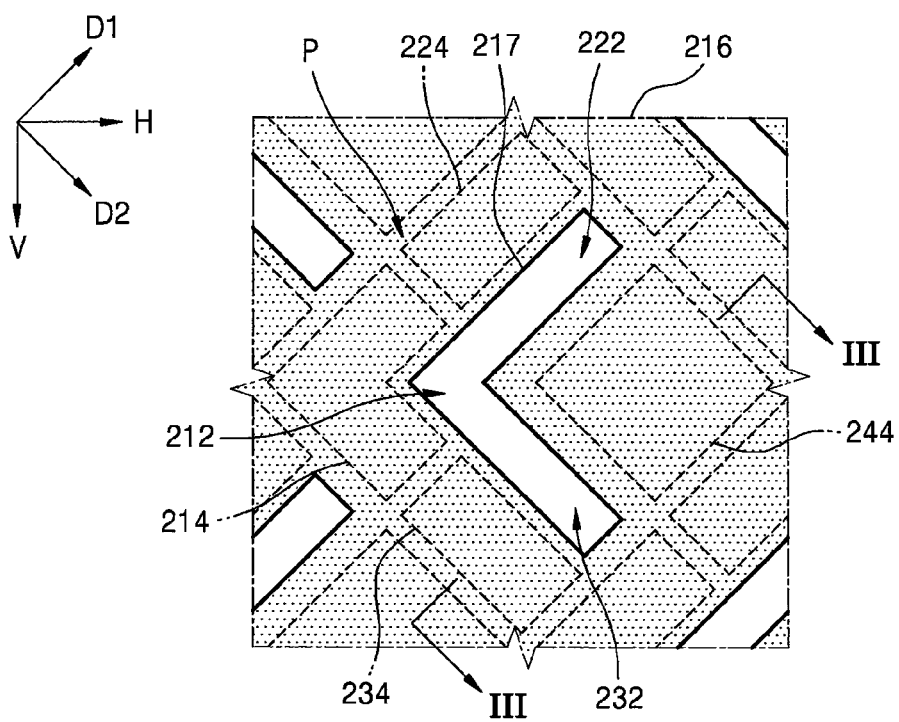
FIG. 9 is a plan view of another embodiment illustrating in detail a portion of an embodiment according to FIG. 4.
Figure 10:
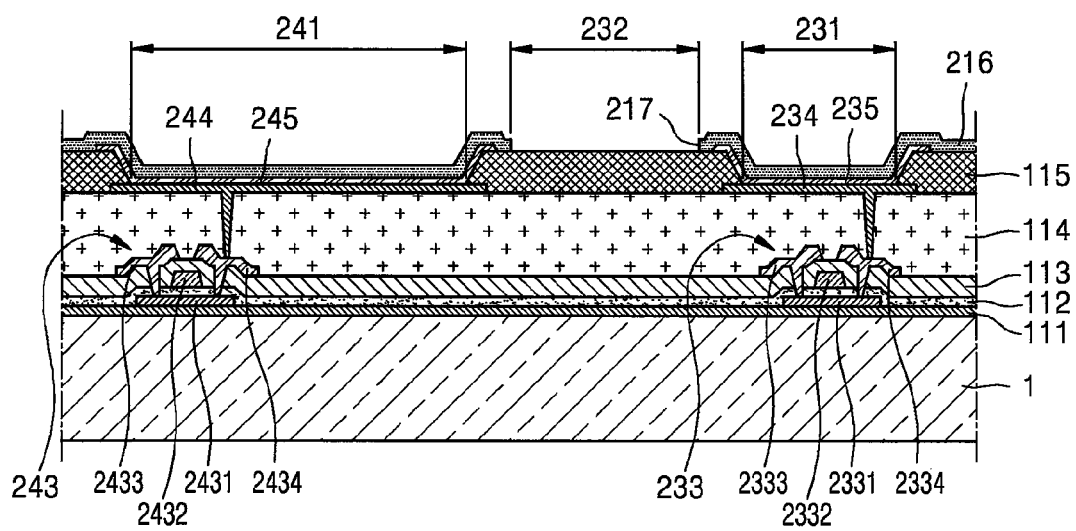
FIG. 10 is a cross-sectional view of an embodiment of line III-III of FIG. 9.

FIG. 9 is a plan view of another embodiment illustrating in more detail a portion of an embodiment according to FIG. 4, and FIG. 10 is a cross-sectional view of an embodiment of line III-III of FIG. 9.

In the embodiment of FIGS. 9 and 10, unlike the embodiment of FIG. 7, the first transmission window 217 may be formed as an opening in the second electrode 216, and may be formed over the first transmission region 212, the second transmission region 222, and the third transmission region 232. In this case, a degradation of a transmittance of external light which is caused by the first to third sub-pixel electrodes and the second electrode is further reduced in the transmission region.

Figure 11:
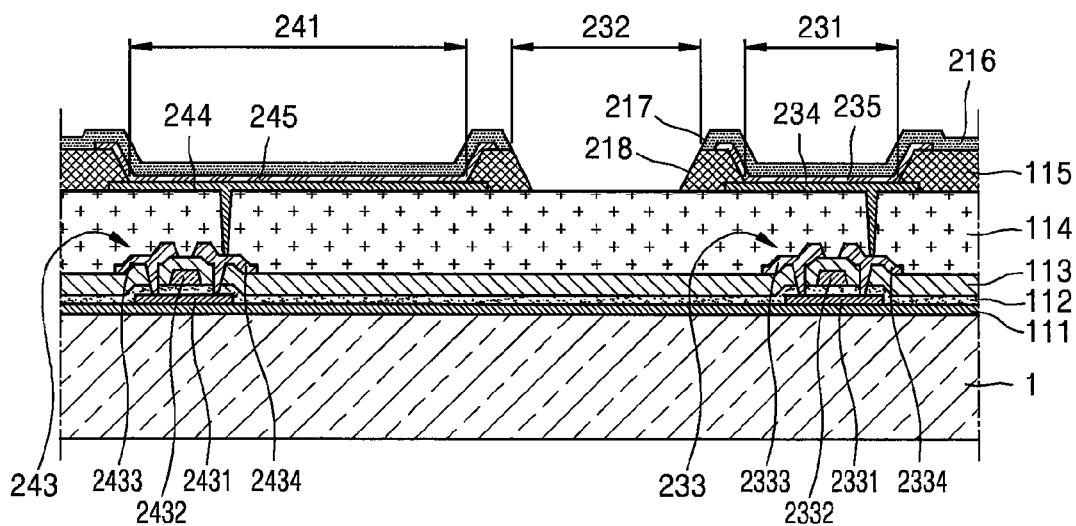
FIG. 11 is a cross-sectional view of another embodiment of line III-III of FIG. 9.

FIG. 11 is a cross-sectional view of another embodiment of line III-III of FIG. 9.

In the embodiment of FIG. 11, unlike the embodiment of FIG. 10, a second transmission window 218 is formed at the pixel defining layer 115 in correspondence with the third transmission region 232. The second transmission window 218 may be formed to be connected to the first transmission window 217 which is formed in the second electrode 216 (e.g., the second transmission window 218 is formed to have edges substantially aligned with those of the first transmission window 217). Thus, the second transmission window 218 may be formed over the first transmission region 212, the second transmission region 222, and the third transmission region 232. The second electrode 216 and the pixel defining layer 115 are removed from the first transmission region 212, the second transmission region 222, and the third transmission region 232 by the first transmission window 217 and the second transmission window 218, and thus, a transmittance of external light is further enhanced.

In FIG. 11, the second transmission window 218 is formed at only the pixel defining layer 115, but the present embodiment is not limited thereto. For example, the second transmission window 218 may be formed as an opening in at least one layer selected from the pixel defining layer 115, the passivation layer 114, the interlayer insulating layer 113, the gate insulating layer 112, and the buffer layer 111.

Moreover, although not shown, a structure in which only the second transmission window 218 is formed and the first transmission window 217 is not formed may be employed. That is, the second transmission window 218 may be formed as an opening in at least one layer selected from the pixel defining layer 115, the passivation layer 114, the interlayer insulating layer 113, the gate insulating layer 112, and the buffer layer 111, and the second electrode 216 may be formed to cover the second transmission window 218 in a state where a transmission window is not formed at the second electrode 216. Since the second electrode 216 is a common electrode which is formed to cover all the pixels, when an opening window is not formed at the second electrode 216, a drop of a voltage is reduced. In this case, the second electrode 216 may be formed of, for example, thin film metal or a transparent conductive layer so as to increase a light transmittance.

Figure 12:
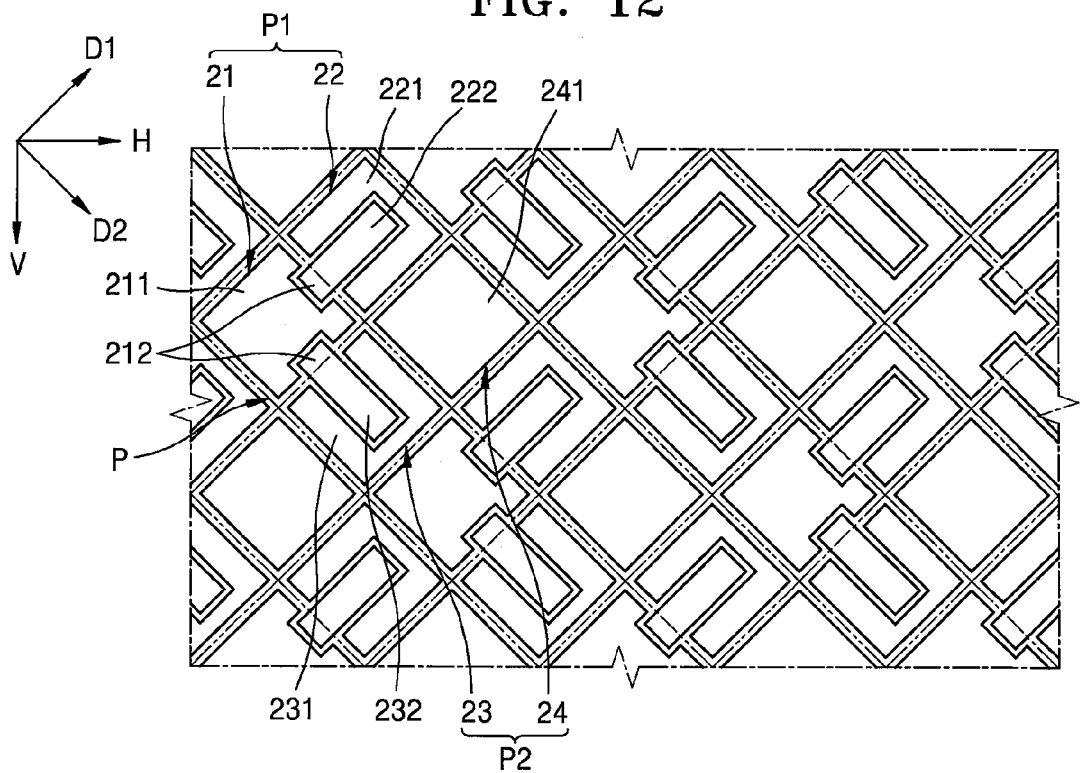
FIGS. 12 to 23 are plan views illustrating embodiments of some pixels of the organic light emitting unit of FIGS. 2 and 3.

FIG. 12 is a plan view illustrating another embodiment of some pixels of the organic light emitting unit 2 of FIGS. 2 and 3.

In the embodiment of FIG. 12, unlike the embodiment of FIG. 4, the first transmission region 212 is divided into two regions, and the divided first transmission regions 212 are respectively connected to the second transmission region 222 and the third transmission region 232. An area of each of the divided first transmission regions 212 is formed narrower than that of each of the second transmission region 222 and the third transmission region 232, and thus, a degradation of an emission efficiency of the first emission region 211 is minimized.

According to this embodiment, the transmission regions may be disposed in the pixel P. Since the transmission regions are surrounded by the first to third emission regions 211 to 231, an effect such as the transmission regions being connected across a whole screen is reduced, and thus, the emission region is not perceived by a user as being disconnected.

Figure 13:
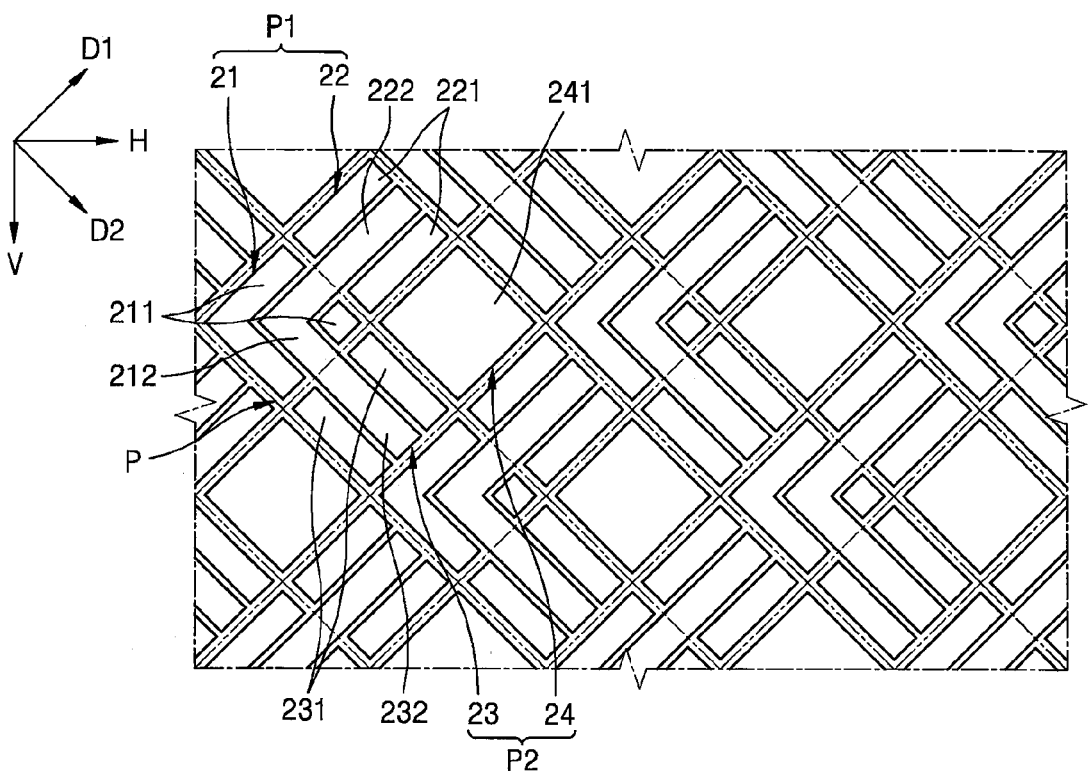

FIG. 13 is a plan view illustrating another embodiment of some pixels of the organic light emitting unit 2 of FIGS. 2 and 3.

In the embodiment of FIG. 13, unlike the embodiment of FIG. 4, the first to third transmission regions 212 to 232 are disposed close to a center of the first to third emission regions 211 to 231. In this case, each of the first to third emission regions 211 to 231 may be divided into two regions by the first to third transmission regions 212 to 232.

Figure 14:
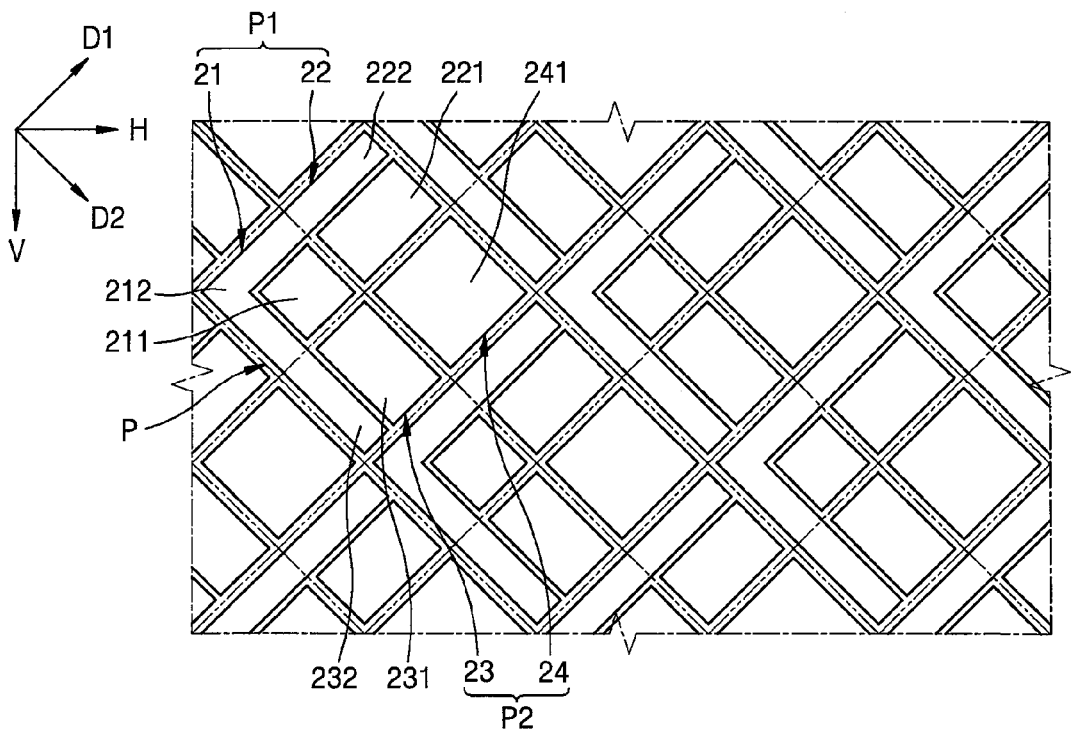

FIG. 14 is a plan view illustrating another embodiment of some pixels of the organic light emitting unit 2 of FIGS. 2 and 3.

In the embodiment of FIG. 14, unlike the embodiment of FIG. 4, the first to third transmission regions 212 to 232 are disposed outside the first to third emission regions 211 to 231. Therefore, the first to third emission regions 211 to 231 may be disposed close to a plurality of the first pixels and the second pixels which are adjacent.

Figure 15:
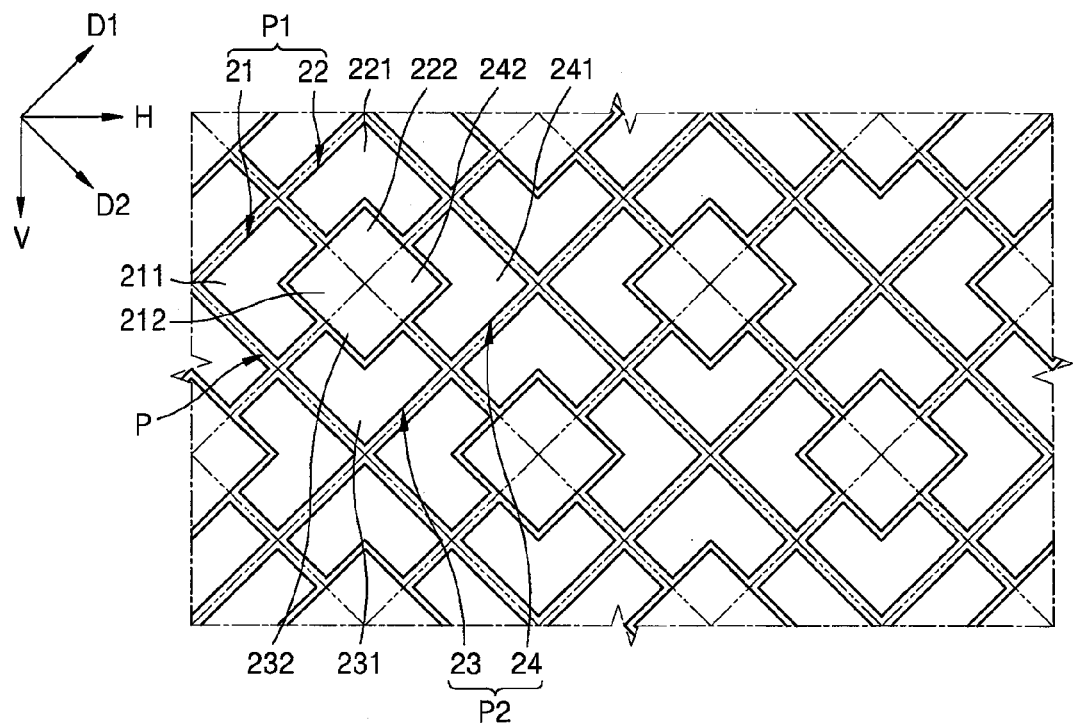

FIG. 15 is a plan view illustrating another embodiment of some pixels of the organic light emitting unit 2 of FIGS. 2 and 3.

The first to fourth sub-pixels 21 to 24 include the first to fourth transmission regions 212 to 242, respectively. The first to fourth transmission regions 212 to 242 may have a structure in which the first to fourth transmission regions 212 to 242 are disposed adjacent to each other as one region at a center, and may be respectively surrounded by the first to fourth emission regions 211 to 241. That is, the first to fourth transmission regions 212 to 242 may form a tetragonal transmission region at a center of the first pixel P1 and the second pixel P2. In this case, since the first to fourth transmission regions 212 to 242 have a dense form, a transmittance is further enhanced.

Figure 16:
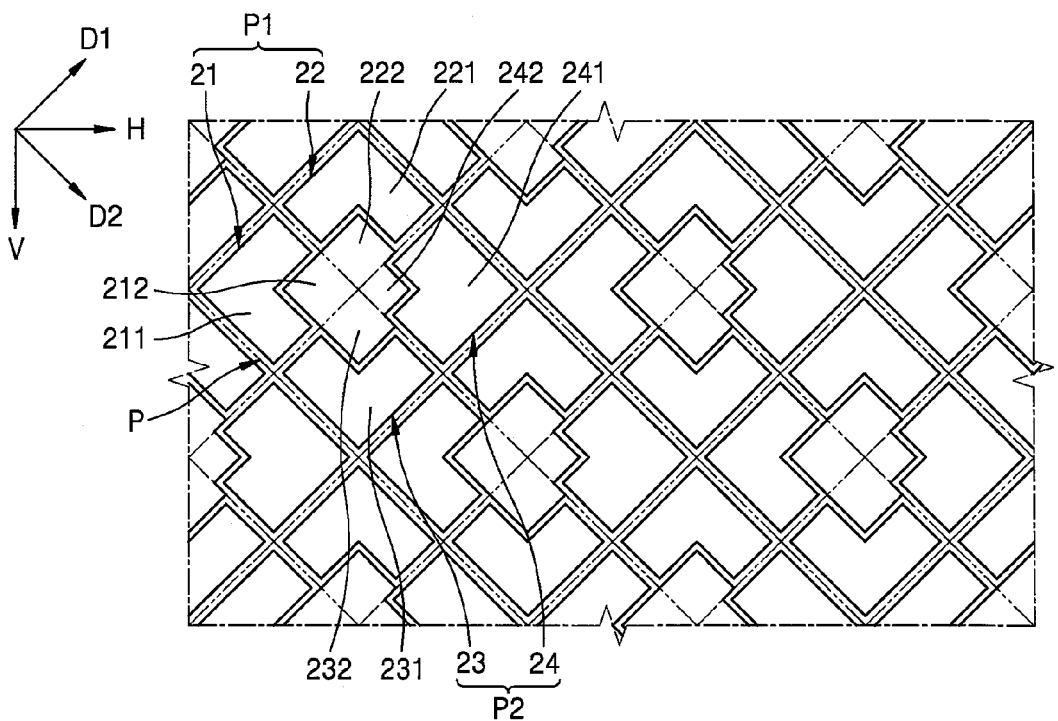

FIG. 16 is a plan view illustrating another embodiment of some pixels of the organic light emitting unit 2 of FIGS. 2 and 3.

In the embodiment of FIG. 16, unlike the embodiment of FIG. 15, an area of the fourth transmission region 242 is formed narrower than those of the first to third transmission regions 212 to 232. When an emission efficiency of the fourth emission region 241 is lower than that of the first to third emission regions 211 to 231, a transmittance is enhanced, and emission efficiency is prevented from being degraded in the fourth sub-pixel 24.

In FIG. 16, the area of the fourth transmission region 242 is formed narrower than those of the first to third transmission regions 212 to 232, but the present embodiment is not limited thereto. For example, an area of the third transmission region 232 may be formed narrower than those of the first and second transmission regions 212 and 222.

That is, an area of each transmission region may be adjusted based on an emission efficiency of each sub-pixel.

Figure 17:
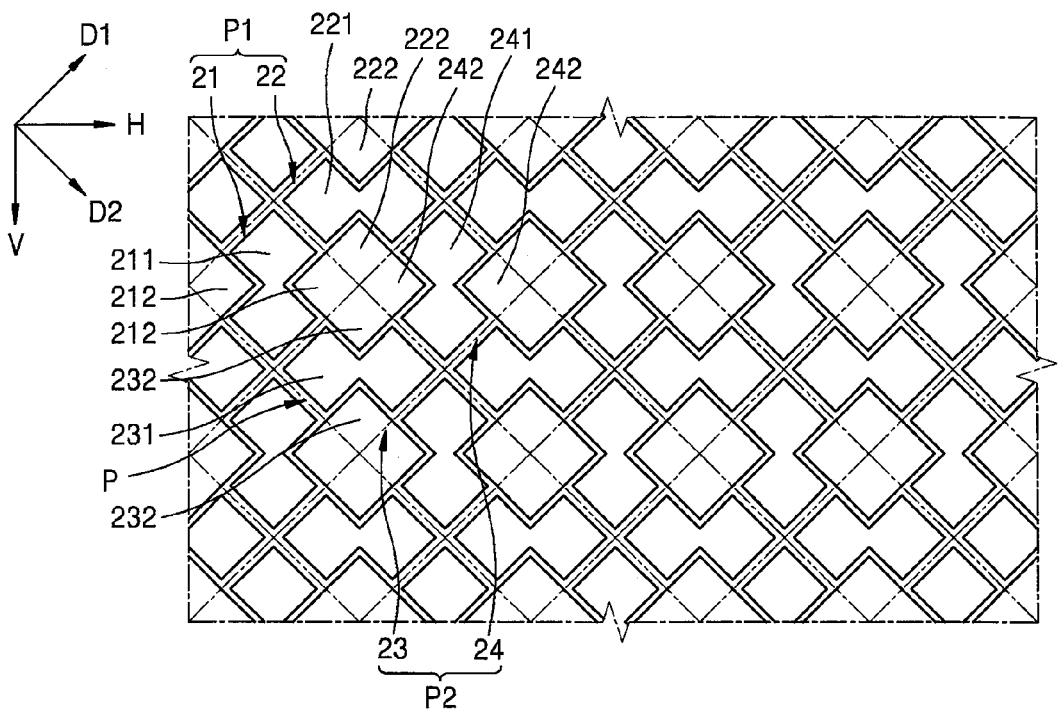

FIG. 17 is a plan view illustrating another embodiment of some pixels of the organic light emitting unit 2 of FIGS. 2 and 3.

In the embodiment of FIG. 17, unlike the embodiment of FIG. 16, the organic light emitting unit 2 may include two first transmission regions 212 to fourth transmission regions in which the first to fourth sub-pixels 21 to 24 are separated from each other. The two first transmission regions 212 may be diagonally disposed along the horizontal direction H in the first sub-pixel 21. The two second transmission regions 222 may be diagonally disposed along the vertical direction V in the second sub-pixel 22. The two third transmission regions 232 may be diagonally disposed along the vertical direction V in the third sub-pixel 23. The two fourth transmission regions 242 may be diagonally disposed along the horizontal direction H in the fourth sub-pixel 24. One first transmission region 212, one second transmission region 222, one third transmission region 232, and one fourth transmission region 242 may be coupled to each other at the center of the first pixel P1 and the second pixel P2 to form a tetragonal transmission region, and the other first transmission region 212, second transmission region 222, third transmission region 232, and fourth transmission region 242 may be coupled to transmission regions of other pixels, which are adjacent to each other outside the first pixel P1 and the second pixel P2, to form a tetragonal transmission region. Therefore, in comparison with the embodiment of FIG. 15, a transmittance of external light is further enhanced.

Although not shown, the embodiment of FIG. 16 may be modified similarly to the embodiment of FIG. 17.

Figure 18:
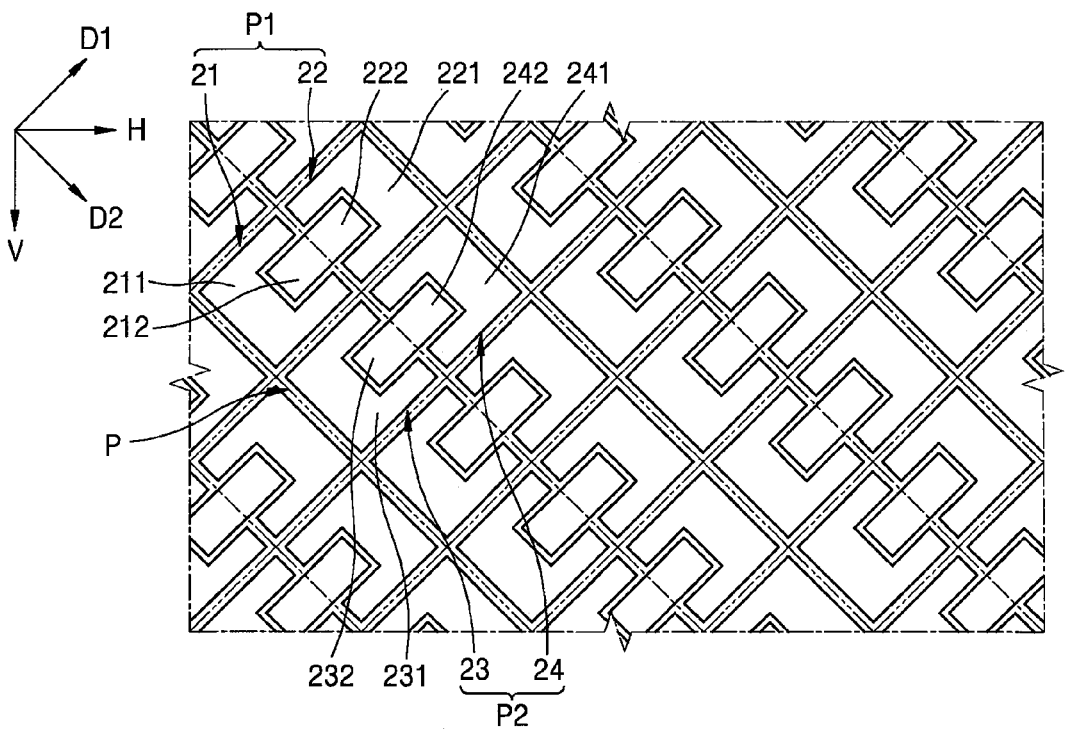

FIG. 18 is a plan view illustrating another embodiment of some pixels of the organic light emitting unit 2 of FIGS. 2 and 3.

Referring to FIG. 18, the first transmission region 212 and the second transmission region 222 are adjacently disposed as one region to face each other, and the third transmission region 232 and the fourth transmission region 242 are adjacently disposed as one region to face each other. Therefore, the first pixel P1 includes a single transmission region which is formed at a center, the second pixel P2 includes a single transmission region which is formed at a center, and the transmission region of the first pixel P1 is not connected to the transmission region of the second pixel P2. The transmission region is included in each of the first pixel P1 and the second pixel P2, the transmission region of the first pixel P1 is surrounded by the first and second emission regions, and the transmission region of the second pixel P2 is surrounded by the third and fourth emission regions. Accordingly, a feeling in which the transmission regions are connected in a whole screen are not given.

Figure 19:
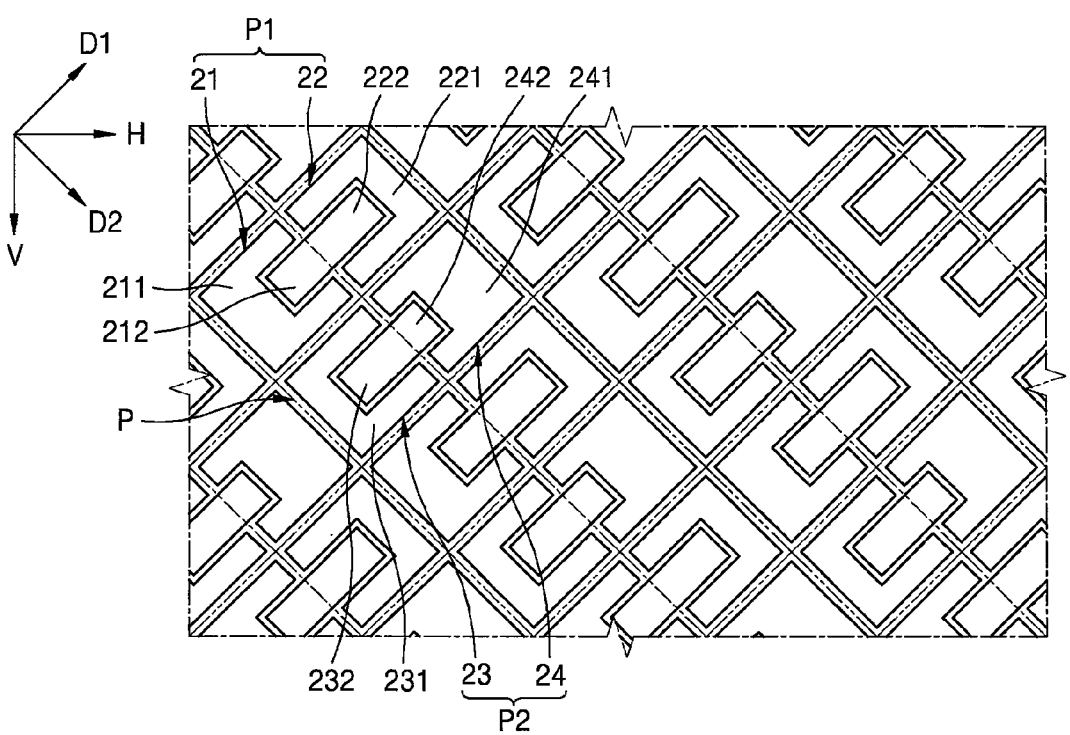

FIG. 19 is a plan view illustrating another embodiment of some pixels of the organic light emitting unit 2 of FIGS. 2 and 3.

In the embodiment of FIG. 19, unlike the embodiment of FIG. 18, an area of the fourth transmission region 242 is narrower than those of the first to third transmission regions 212 to 232, and an area of each of the second transmission region 222 and the third transmission region 232 is broader than that of the first transmission region 212. The embodiment of FIG. 19 is an example, and in the embodiment of FIG. 18, an area of each of the first to fourth transmission regions 212 to 242 may be adjusted based on an emission efficiency of each of the first to fourth emission regions 211 to 241. In this case, when the second emission region 221 and the third emission region 231 are formed to have the same color, an area of each of the second transmission region 222 and the third transmission region 232 may be determined to be the broadest irrespectively of an emission efficiency of each of the second emission region 221 and the third emission region 231.

Figure 20:
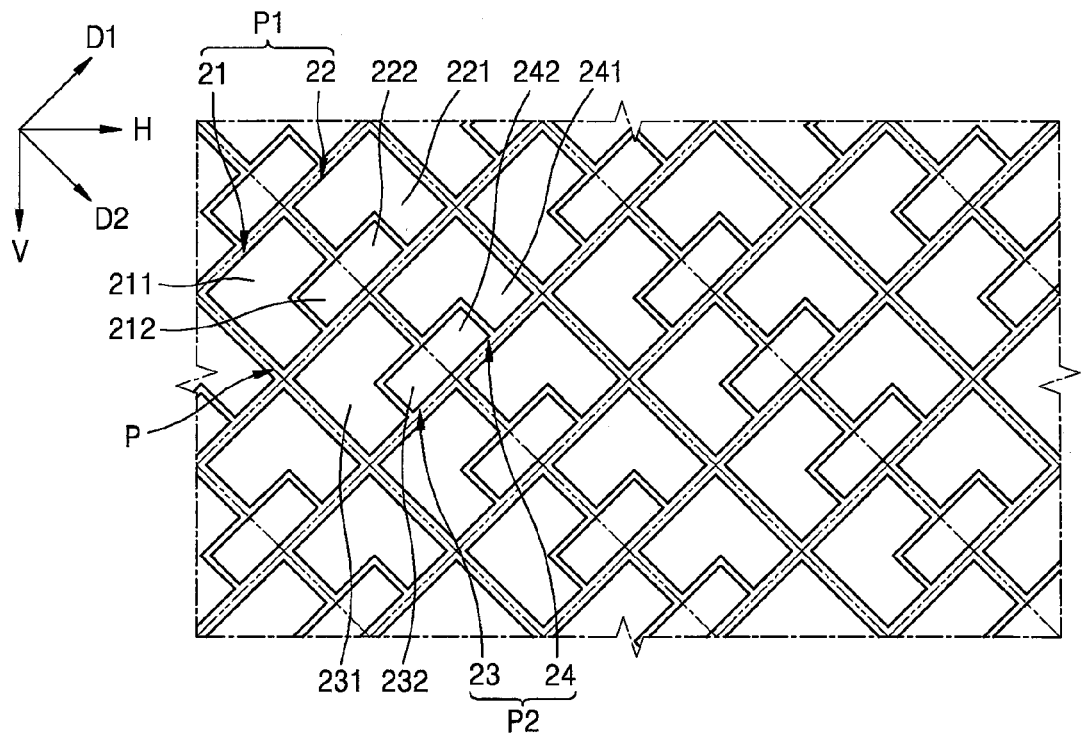

FIG. 20 is a plan view illustrating another embodiment of some pixels of the organic light emitting unit 2 of FIGS. 2 and 3.

In the embodiment of FIG. 20, unlike the embodiment of FIG. 18, the first transmission region 212 and the second transmission region 222 are disposed adjacent to the third emission region 231 and the fourth emission region 241, and the third transmission region 232 and the fourth transmission region 242 are disposed adjacent to the first emission region 211 and second emission region 221 of the first sub-pixel and the second sub-pixel which are adjacent to each other. The arrangement of the first to fourth transmission regions 212 to 242 may be opposite thereto; for example, the first transmission region 212 and the second transmission region 222 may be disposed adjacent to the first emission region 211 and second emission region 221, and the third transmission region 232 and the fourth transmission region 242 may be disposed adjacent to the third emission region 231 and the fourth emission region 241.

Figure 21:
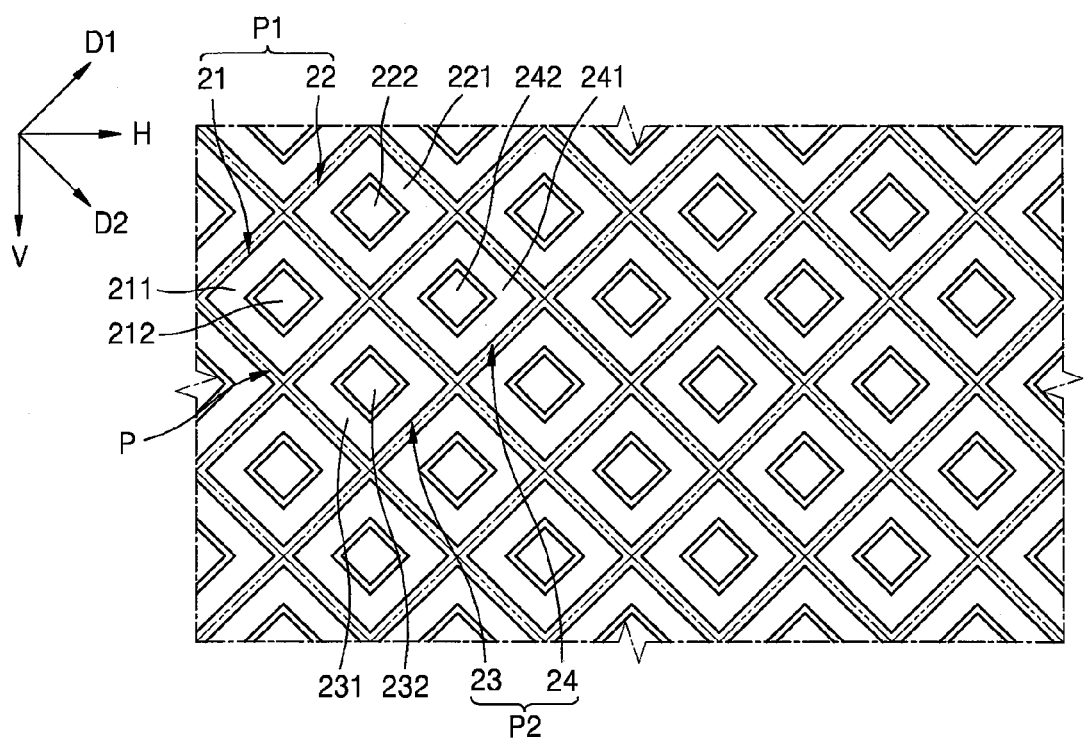

FIG. 21 is a plan view illustrating another embodiment of some pixels of the organic light emitting unit 2 of FIGS. 2 and 3.

The first to fourth transmission regions 212 to 242 are disposed at respective centers of the first to fourth emission regions 211 to 241, and are surrounded by the first to fourth emission regions 211 to 241. In this case, the transmission region may be formed so that a dot pattern is formed in each sub-pixel, and a uniform transmission region may be wholly formed.

Figure 22:
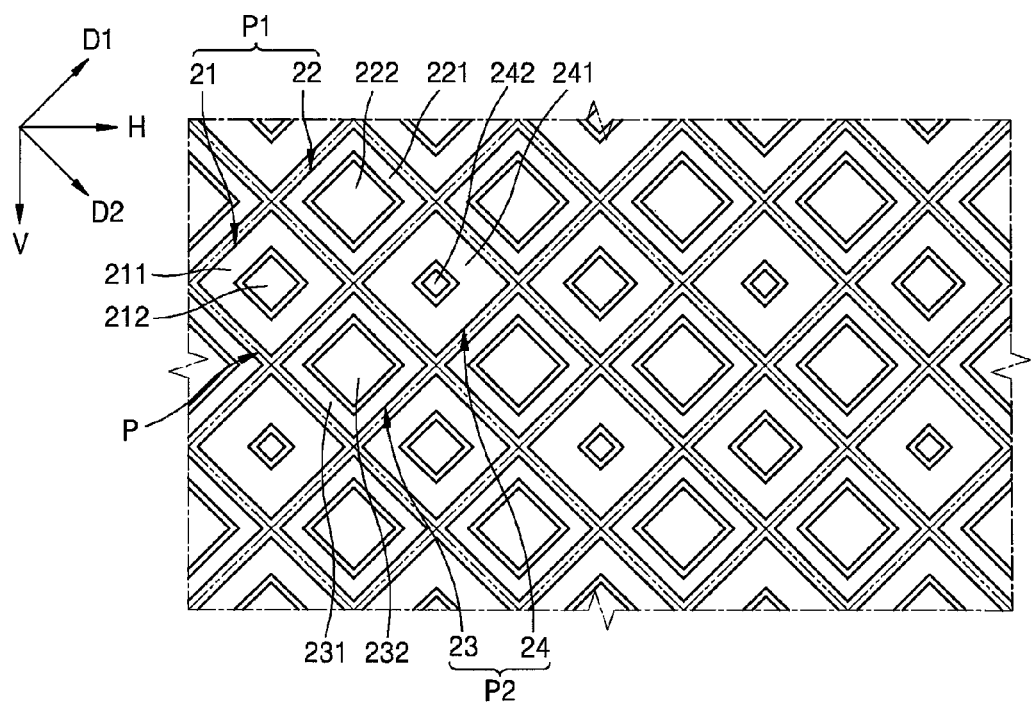

FIG. 22 is a plan view illustrating another embodiment of some pixels of the organic light emitting unit 2 of FIGS. 2 and 3.

In the embodiment of FIG. 22, unlike the embodiment of FIG. 21, an area of the fourth transmission region 242 is narrower than those of the first to third transmission regions 212 to 232, and an area of each of the second transmission region 222 and the third transmission region 232 is broader than that of the first transmission region 212. The embodiment of FIG. 22 is an example, and in the embodiment of FIG. 21, an area of each of the first to fourth transmission regions 212 to 242 may be adjusted based on an emission efficiency of each of the first to fourth emission regions 211 to 241. In this case, when the second emission region 221 and the third emission region 231 are formed to have the same color, an area of each of the second transmission region 222 and the third transmission region 232 may be determined to be the broadest irrespective of an emission efficiency of each of the second emission region 221 and the third emission region 231.

Figure 23:
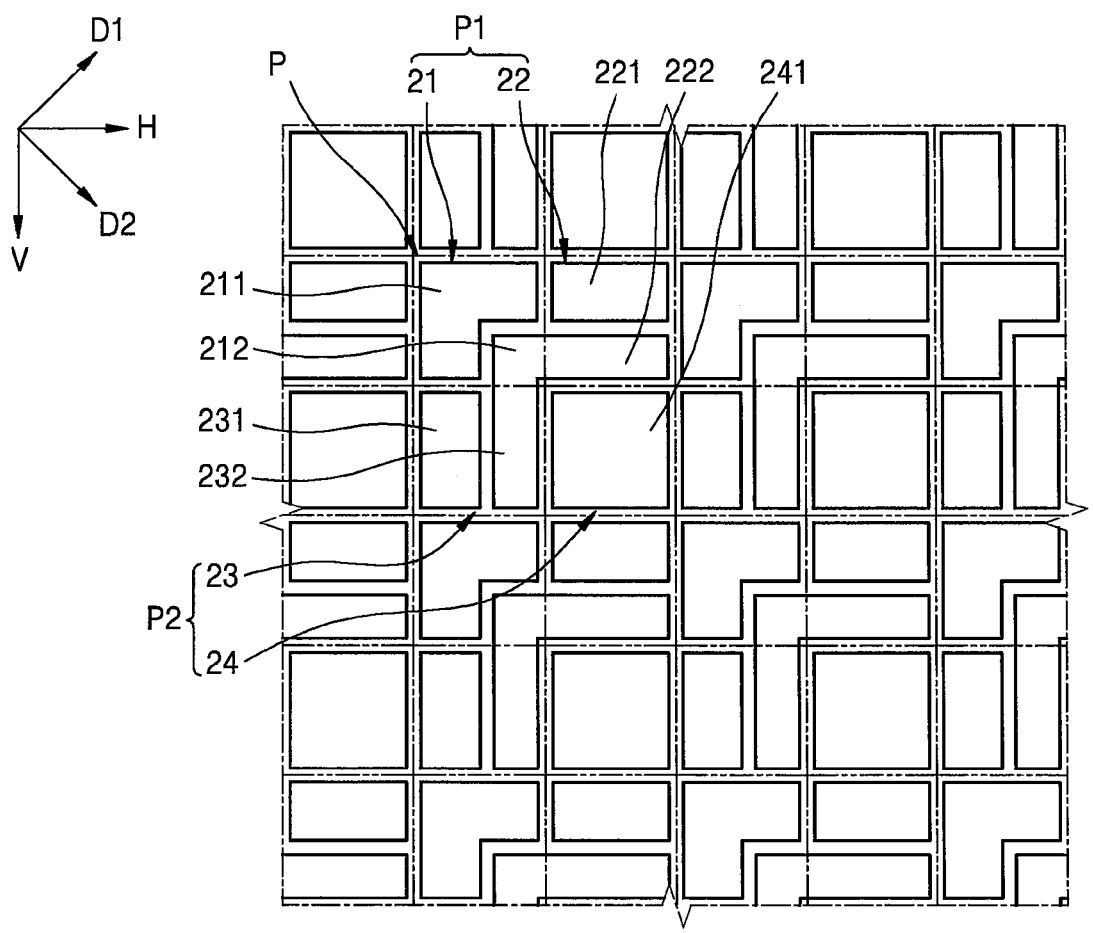

In the above-described embodiments, the first sub-pixel 21 and the second sub-pixel 22 are arranged in parallel in the first direction D1, the third sub-pixel 23 and the fourth sub-pixel 24 are arranged in parallel in the first direction D1, and the first pixel P1 and the second pixel P2 are arranged in parallel in the second direction D2. However, the present invention is not limited thereto. As seen in FIG. 23, the first sub-pixel 21 and the second sub-pixel 22 are arranged in parallel in the horizontal direction H, the third sub-pixel 23 and the fourth sub-pixel 24 are arranged in parallel in the horizontal direction H, and the first pixel P1 and the second pixel P2 are arranged in parallel in the vertical direction V. FIG. 23 illustrates a modification example of the embodiment of FIG. 4, and the modification example of FIG. 23 may be applied to the embodiments of FIGS. 12 to 22.

As described above, according to the one or more of the above embodiments of the present invention, since a transmittance of a transmitting portion becomes higher, a transparent or see-through display is implemented. Since a transmission region is not connected, a feeling in which the emission regions are wholly connected is given. Accordingly, a disconnection of a line unit is not felt, and a feeling in which a color is displayed to be disconnected is reduced.

Moreover, an area of the transmission region is changed based on an emission efficiency of a sub-pixel, and thus, the transparent or see-through display with enhanced emission efficiency is implemented.

Accordingly, a high resolution is realized.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and equivalents thereof.

What is claimed is:

1. An organic light emitting display device comprising a plurality of pixels, each of the plurality of pixels comprising:
   a first sub-pixel including a first emission region to generate light of a first color;
   a second sub-pixel disposed adjacent to the first sub-pixel in a plane normal to a thickness direction of the display device, and including a second emission region to generate light of a second color;
   a third sub-pixel disposed adjacent to the first sub-pixel in the plane, and including a third emission region to generate light of a third color; and
   a fourth sub-pixel disposed adjacent to the second and third sub-pixels in the plane, and including a fourth emission region to generate light of a fourth color,
   wherein at least one of the first, second, third or fourth sub-pixels comprises a transmission region which cannot emit light and which is to transmit external light through the display device, the transmission region being adjacent to at least one of the first, second, third or fourth emission regions in the plane,
   wherein the transmission region is disposed inside of each of the plurality of pixels, and
   wherein the transmission region of each of the plurality of pixels is separated from transmission regions of any adjacent pixels on the plane by at least one of the first, second, third, and fourth emission regions.

2. The organic light emitting display device of claim 1, wherein the transmission region comprises:
   a first transmission region disposed in the first sub-pixel;
   a second transmission region disposed in the second sub-pixel; and
   a third transmission region disposed in the third sub-pixel.

3. The organic light emitting display device of claim 2, wherein:
   the fourth emission region has lower emission efficiency than that of each of the first to third emission regions, and
   the transmission region does not extend into the fourth sub-pixel.

4. The organic light emitting display device of claim 2, wherein at least two of the first to third transmission regions are contiguous.

5. The organic light emitting display device of claim 4, wherein at least one portion of the transmission region is disposed adjacent to the fourth sub-pixel.

6. The organic light emitting display device of claim 2, wherein the transmission region further comprises a fourth transmission region disposed in the fourth sub-pixel.

7. The organic light emitting display device of claim 6, wherein the first to fourth transmission regions are disposed adjacent to each other as one region.

8. The organic light emitting display device of claim 7, wherein each of the first to fourth sub-pixels comprises a plurality of first to fourth transmission regions, respectively.

9. The organic light emitting display device of claim 6, wherein:
the first and second transmission regions are disposed adjacent to each other as one region, and
the third and fourth transmission regions are disposed adjacent to each other as one region.

10. The organic light emitting display device of claim 9, wherein:
the first and second transmission regions are not adjacent to the third and fourth emission regions, and
the third and fourth transmission regions are not adjacent to the first and second emission regions.

11. The organic light emitting display device of claim 9, wherein:
the fourth emission region has lower emission efficiency than that of each of the first to third emission regions, and
the fourth transmission region has a narrower area than that of each of the first to third transmission regions.

12. The organic light emitting display device of claim 9, wherein the first and second transmission regions are adjacent to the third and fourth emission regions, respectively.

13. The organic light emitting display device of claim 6, wherein no two transmission regions of the first to fourth transmission regions are connected to each other.

14. The organic light emitting display device of claim 13, wherein:
the fourth emission region has lower emission efficiency than that of each of the first to third emission regions, and
the fourth transmission region has a narrower area than that of each of the first to third transmission regions.

15. The organic light emitting display device of claim 1, wherein:
the first color is red,
the second color and third color are green, and
the fourth color is blue.

16. The organic light emitting display device of claim 1, wherein:
the second sub-pixel is adjacent to the first sub-pixel in a first direction which is inclined with respect to a horizontal direction,
the third sub-pixel is adjacent to the first sub-pixel in a second direction which is inclined with respect to a vertical direction, and
the fourth sub-pixel is adjacent to the third sub-pixel in the first direction and is adjacent to the second sub-pixel in the second direction.

17. The organic light emitting display device of claim 1, wherein:
the second sub-pixel is aligned adjacent to the first sub-pixel in a horizontal direction,
the third sub-pixel is aligned adjacent to the first sub-pixel in a vertical direction, and
the fourth sub-pixel is aligned adjacent to the third sub-pixel in the horizontal direction and is aligned adjacent to the second sub-pixel in the vertical direction.

18. The organic light emitting display device of claim 1, further comprising:
first to fourth sub-pixel electrodes that are formed on a substrate, and are respectively disposed in the first to fourth sub-pixels;
an opposite electrode that is disposed to be opposite to the first to fourth sub-pixel electrodes; and
first to fourth emission layers that are respectively disposed between the first to fourth sub-pixel electrodes and the opposite electrode.

19. The organic light emitting display device of claim 18, wherein:
the first to fourth sub-pixel electrodes are formed to have the same shape,
at least one of the first to fourth sub-pixel electrodes overlaps the transmission region, and
the opposite electrode comprises a first transmission window in which a region corresponding to the transmission region is opened.

20. The organic light emitting display device of claim 18, wherein at least one of the first to fourth sub-pixel electrodes is not formed in a region corresponding to the transmission region.

21. The organic light emitting display device of claim 20, wherein the opposite electrode comprises a first transmission window in which a region corresponding to at least a portion of the transmission region is opened.

22. The organic light emitting display device of claim 20, further comprising at least one insulating layer formed on the substrate, wherein the at least one insulating layer comprises a second transmission window in which a region corresponding to at least a portion of the transmission region is opened.

23. The organic light emitting display device of claim 18, wherein the substrate is flexible.

24. An organic light emitting display device comprising:
a substrate;
an organic light emitting unit formed on the substrate; and
a sealing unit formed on the substrate, and sealing the organic light emitting unit,
wherein the organic light emitting unit comprises:
a plurality of first pixels, each including:
a first sub-pixel configured to generate light of a first color; and
a second sub-pixel configured to generate light of a second color different from the first color;
a plurality of second pixels, each including:
a third sub-pixel configured to generate light of a third color different from any color generated by any of the plurality of first pixels; and
a fourth sub-pixel configured to generate light of a fourth color different from the third color,
each second pixel being configured to generate light along with at least one sub-pixel of a corresponding first pixel to realize full white color, wherein the plurality of first pixels and the plurality of second pixels are alternately disposed along one direction; and
a plurality of transmission regions that are disposed in at least one of the sub-pixels of the plurality of first pixels and the plurality of second pixels, the plurality of transmission regions configured to transmit external light in a direction which passes through the substrate, the organic light emitting unit, and the sealing unit, the plurality of transmission regions separated from each other, and the plurality of transmission regions configured to not emit light, and to transmit light through the display device, wherein each of the plurality of transmission regions are separated from any adjacent transmission region on a plane normal to a thickness direction of the display device by emission regions of at least one of the first, second, third, and fourth sub-pixels.

25. The organic light emitting display device of claim 24, wherein:

each of the plurality of first pixels comprises a red sub-pixel and a green sub-pixel, each of the plurality of second pixels comprises a green sub-pixel and a blue sub-pixel, and the green sub-pixel of each first pixel is aligned not to be adjacent to the green sub-pixel of each second pixel.

26. The organic light emitting display device of claim 24, wherein:

the first pixels of the plurality of first pixels and the second pixels of the plurality of second pixels extend along a first direction which is inclined with respect to a horizontal direction, and the first pixels of the plurality of first pixels and the second pixels of the plurality of second pixels are alternately disposed along a second direction which is inclined with respect to a vertical direction.

27. The organic light emitting display device of claim 24, wherein:

the first pixels of the plurality of first pixels and the second pixels of the plurality of second pixels extend along a horizontal direction, and the first pixels of the plurality of first pixels and the second pixels of the plurality of second pixels are alternately disposed along a vertical direction.

28. The organic light emitting display device of claim 24, wherein the organic light emitting unit comprises:

a plurality of sub-pixel electrodes that are respectively disposed in the sub-pixels of the plurality of first pixels and the plurality of second pixels, and are separated from each other; and an opposite electrode that is disposed to be opposite to the plurality of sub-pixel electrodes, and at least one of the sub-pixels does not overlap any of the plurality of transmission regions.

29. The organic light emitting display device of claim 24, wherein the organic light emitting unit comprises:

a plurality of sub-pixel electrodes that are respectively disposed in the sub-pixels of the plurality of first pixels and the plurality of second pixels, and are separated from each other; and an opposite electrode that is disposed to be opposite to the plurality of sub-pixel electrodes, and comprises a plurality of first transmission windows, being regions, corresponding to at least portions of the plurality of transmission regions, opened through the opposite electrode.

30. The organic light emitting display device of claim 24, wherein:

the organic light emitting unit further comprises at least one insulating layer that is formed on the substrate, and the at least one insulating layer comprises a plurality of second transmission windows, being regions, corresponding to at least portions of the plurality of transmission regions, opened through the at least one insulating layer.

31. The organic light emitting display device of claim 24, wherein the substrate and the sealing unit are configured to be flexible.

32. An organic light emitting display device comprising a plurality of pixels, each of the plurality of pixels comprising:

a first sub-pixel including a first emission region to emit light of a first color;

a second sub-pixel disposed adjacent to the first sub-pixel, and including a second emission region to emit light of a second color;

a third sub-pixel disposed adjacent to the first sub-pixel, and including a third emission region to emit light of a third color; and a fourth sub-pixel disposed adjacent to the second and third sub-pixels, and including a fourth emission region to emit light of a fourth color, wherein at least one of the first, second, third or fourth sub-pixels comprises a transmission region which cannot emit light and which is to transmit external light, and wherein the transmission region is disposed inside of each of the plurality of pixels, wherein the transmission region comprises:

a first transmission region disposed in the first sub-pixel;

a second transmission region disposed in the second sub-pixel; and a third transmission region disposed in the third sub-pixel, wherein the transmission region further comprises a fourth transmission region disposed in the fourth sub-pixel, wherein the first to fourth transmission regions are disposed adjacent to each other as one region, and wherein:

the fourth emission region has a lower emission efficiency than that of each of the first to third emission regions, and the fourth transmission region has a narrower area than that of each of the first to third transmission regions.

* * * * *